United States Patent [19]
Arnold et al.

[11] Patent Number: 5,401,909
[45] Date of Patent: Mar. 28, 1995

[54] PRINTED CIRCUIT BOARD WITH LOCALLY ENHANCED WIRING DENSITY

[75] Inventors: Hans Arnold, Herrenberg; Peter Lueck, Leonberg; Guenther Mohr, Aidlingen; Theis ZurNieden, Schoenaich, all of Germany

[73] Assignee: International Business Machines Corporation, Armonk, N.Y.

[21] Appl. No.: 153,596

[22] Filed: Nov. 17, 1993

[30] Foreign Application Priority Data

Dec. 12, 1992 [EP] European Pat. Off. ............ 92121216

[51] Int. Cl.⁶ .............................................. H05K 1/00
[52] U.S. Cl. ................................. 174/250; 174/251; 174/262; 174/264; 361/777
[58] Field of Search ............... 174/250, 251, 255, 262, 174/264; 361/777, 792

[56] References Cited

U.S. PATENT DOCUMENTS

5,110,664  5/1992  Nakanishi et al. .
5,272,645  12/1993  Kawakami et al. .

FOREIGN PATENT DOCUMENTS

0498258  1/1992  European Pat. Off. ....... H05K 3/46

*Primary Examiner*—Leo P. Picard
*Assistant Examiner*—Cheryl R. Figlin
*Attorney, Agent, or Firm*—Lawrence R. Fraley

[57] ABSTRACT

A printed circuit board and a method for making same is disclosed whereby a very high wiring density is provided in those regions of the printed circuit board in which external components (e.g., semiconductor chips) are to be attached directly. An automated registration routine permits very precise registration and positioning in those regions.

6 Claims, 5 Drawing Sheets

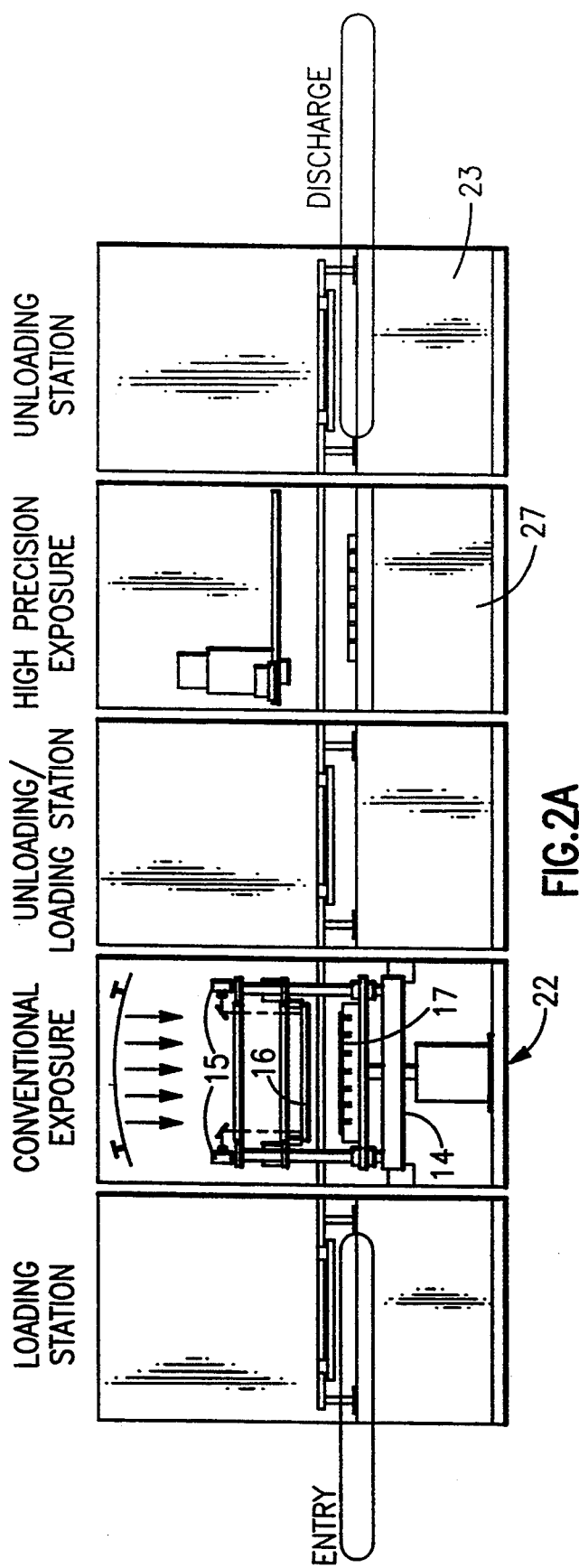
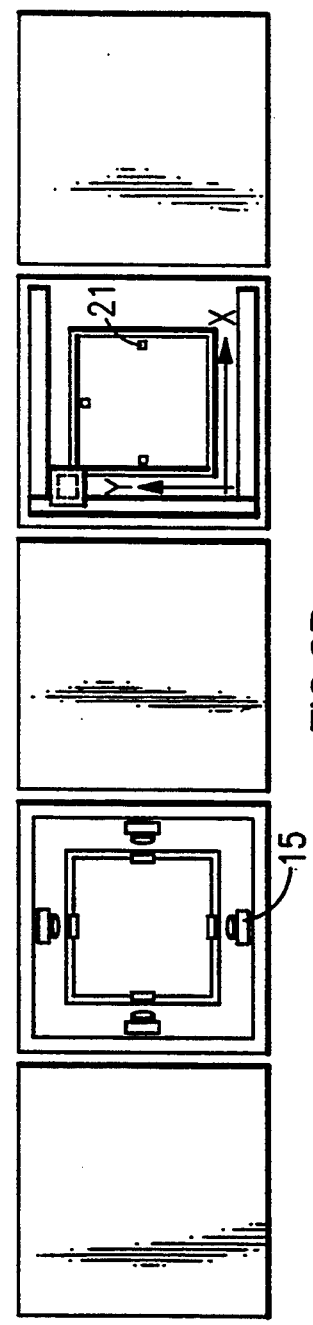
FIG.2A
FIG.2B ns PRINTED CIRCUIT BOARD WITH LOCALLY ENHANCED WIRING DENSITY

TECHNICAL FIELD

The invention relates to printed circuit boards and a method for the manufacture of printed circuit boards.

BACKGROUND

The dramatically increasing integration density of modern semiconductor components such as microprocessors or logic chips is necessarily accompanied by an increase in the number and density of connecting input/output (I/O) terminals on the chip. Modules capable of accommodating chips with more than 400 terminals are already known. However, the footprint of such devices is significantly greater than that of previously used components. The requirements on critical signal delay times within data processing systems, however, increasingly demand ever shorter minimum distances between critical chips.

It is possible to satisfy these requirements by mounting a number of chips on complex multi-chip modules thereby making the distances between critical chips extremely small.

It would, however, be preferable to solder the chips directly onto the circuit board using direct chip attach (DCA) processes, as this would make an entire packaging level superfluous and consequently it would be possible to achieve considerable cost savings in addition to the reduced signal delays. In this event, however, the conducting line widths and spacings and the corresponding through holes close to the chip must be considerably smaller than is feasible with conventional printed circuit board technology.

A series of proposals for the solution of this problem have been made, for instance, one example being to use what is referred to as a surface laminar circuit (SLC) process, in which chips may be soldered directly to the contacts of the board through two thin film layers on the surface of a conventional printed circuit board. This manufacturing process is relatively complex and demands relatively costly registration and smoothing procedures.

DISCLOSURE OF THE INVENTION

It is an object of the invention to provide a printed circuit board and a process for the manufacture of printed circuit boards wherein the resulting boards include adequate wiring capacity for the direct application of chips.

It is another object of the invention to provide such a process which can be carried out at favorable cost and in an expeditious manner.

In accordance with one aspect of the invention, there is provided a printed circuit board comprising a dielectric material having at least one inner electrically conductive layer, electrically conducting lines located on an external surface of the dielectric material in a first region having a first wiring density, a layer of a second dielectric material substantially covering a sub-region of the first region of the electrically conducting lines and including a plurality of holes therein, selected ones of the holes being located relative to respective ones of the conducting lines in the sub-region, and a plurality of electrical conductors located on the layer of second dielectric material and electrically coupled to the respective ones of the conducting lines in the sub-region through the holes, the electrical conductors being of a second wiring density substantially greater than the first wiring density of the electrically conducting lines.

In accordance with another aspect of the invention, there is provided a method (process) of making a printed circuit board. The method comprises the steps of providing a dielectric material having at least one inner electrically conductive layer, providing a plurality of electrically conducting lines on an external surface of the dielectric material in a first region having a first wiring density, providing a layer of a second dielectric material over a sub-region of the first region to substantially cover selected ones of the electrically conducting lines, providing a plurality of holes in the layer of the second dielectric material relative to respective ones of the electrically conducting lines in the sub-region, and providing a plurality of electrical conductors on the second dielectric material electrically coupled to the respective ones of the electrically conducting lines in the sub-region through the holes, the electrical conductors being provided of a second wiring density substantially greater than the first wiring density of the electrically conducting lines.

The method disclosed in the invention makes it possible to provide a very high wiring density only in the sub-regions of the printed circuit board in which semiconductor components are to be directly attached, e.g., in regions with very high requirements for I/O density. In this way, the critical operations in the procedure need only be executed at a few locations on the printed circuit board.

Furthermore, problems with the requirements on flatness (planarity) in the DCA chip region can be avoided in this way.

It is thus possible to manufacture printed circuit boards having a first region with a first wiring density and a second sub-region (of the first region) with a second wiring density, the first wiring density being greater than approximately 5 $cm/cm^2$, preferably 10 $cm/cm^2$, and the second wiring density greater than 20 $cm/cm^2$, preferably 40 $cm/cm^2$.

It is therefore possible to place both pin in hole (PIH) and surface mount technique (SMT) components and chips on a single card at the same time at favorable cost and in an expeditious manner.

In addition, by using a suitable automated registration routine as defined herein, it is possible to achieve a very precise registration and positioning during the relevant operations in the procedure.

The method of the invention will be explained in detail below on the basis of the drawings.

BRIEF DESCRIPTION OF DRAWINGS

FIGS. 2A and 2B illustrate an automated exposure and registration system for implementing the process of the invention;

BEST MODE FOR CARRYING OUT THE INVENTION

For a better understanding of the invention, together with other and further objects, advantages, and capabilities thereof, reference is made to the following disclosure and appended claims in connection with the above described drawings.

As revealed in FIG. 1, in a first step the printed circuit board 1 is manufactured of a known dielectric 1A having electrically conductive inner layers 7 and further including structured outer layers, i.e. including conducting lines 2 comprised of known electrically conductive material. The manufacturing methods generally known in printed circuit board technology may be used for this operation. The wiring density of conducting lines 2 corresponds to that of a first region 4, e.g., it is greater than approximately 5 cm/cm$^2$, preferably approximately 10 cm/cm$^2$ (FIG. 1A). Wiring density is understood to mean the total length of wire per an established area (e.g., of surface) of the corresponding article (printed circuit board) including the wiring. Thus, 10 cm/10 cm$^2$ means a total length of 10 centimeters of wire (lines) per 10 square centimeters of board area.

Figure 1A:
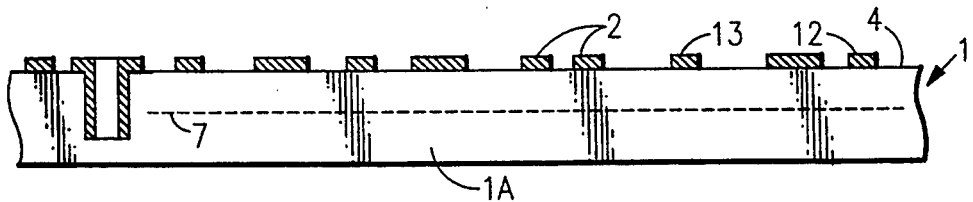
FIGS. 1A–1I illustrate the various steps in the process of this invention.
Figure 1B:
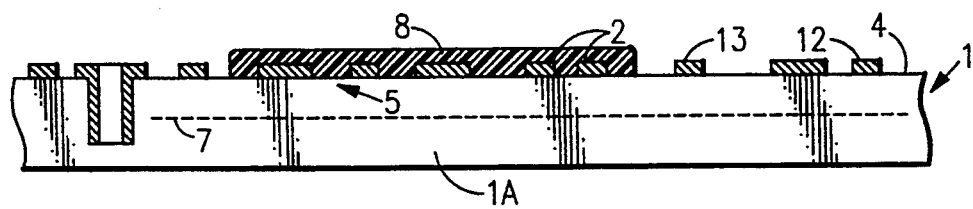

A thin layer of a suitable dielectric 8 is then applied to the surface of the printed circuit board at the positions intended for the later DCA process, e.g., in a sub-region (of region 4) 5 of printed circuit board 1. This process may be completed using a vacuum laminating press, for instance. Any polymer material with a dielectric constant in the range between approximately 2.5 to approximately 3.5 may be used as the dielectric. Pure or reinforced polyimide is, however, used for preference. The thickness of the film is selected in accordance with the electrical configuration (impedance, conducting line spacing) and is preferably 25–50 µm (FIG. 1B). As seen in FIG. 2, region 4 (including conducting lines 2, 12 and 13) is of a width greater than that of its sub-region 5, defined substantially, as mentioned above, by the thin layer of dielectric 8. As further seen, this thin layer of dielectric 8 does not include an internal conducting layer but instead serves to substantially cover a selected number of lines 2.

Figure 1C:
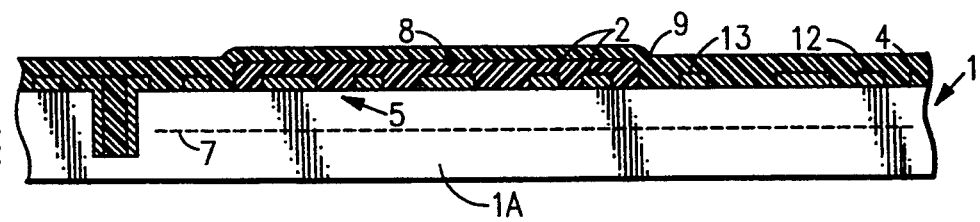
Figure 1D:
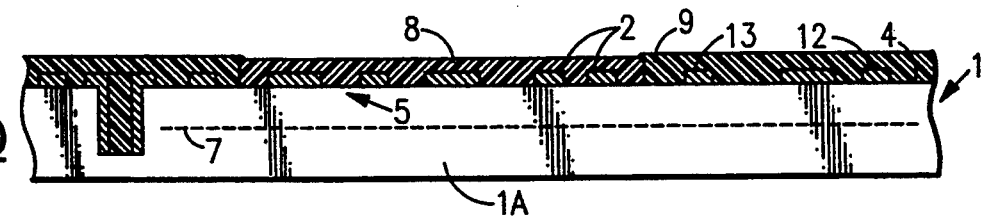

In the next operation, the entire surface of said printed circuit board 1 is coated with a first photoresist 9, registered, exposed and the previously laminated sub-region 5 revealed by development of the photoresist (FIGS. 1C, 1D).

Figure 1E:
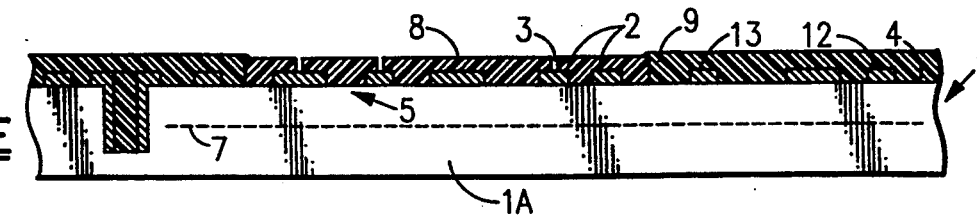

Holes 3 are next made to the conducting lines 2 through the exposed dielectric 8 in sub-region 5. Holes 3 may be made by known methods (drilling, etching). For preference, however, a suitable laser method, for example an excimer laser, is used, as this makes it possible to create interconnection holes (blind holes) with a very small diameter (<100 µm) (FIG. 1E).

Clearly, the method of this invention makes it possible to create not only blind holes, but also through-connection holes, for instance.

Figure 1F:
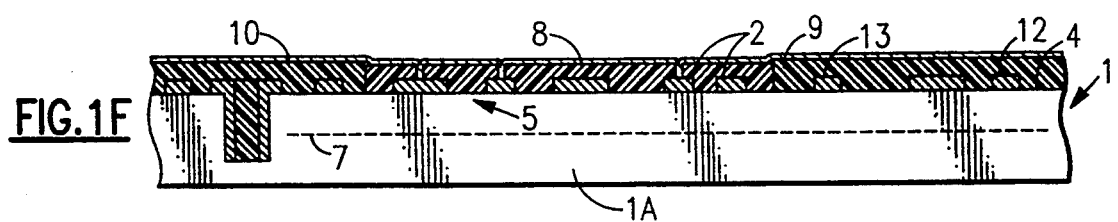

Following a suitable pre-treatment (such as the application of a palladium seed layer, for example), a relatively thin metal layer 10 (preferably <16 µm), preferably copper, is then applied by electrodeposition over the full area of said printed circuit board 1, especially on sub-region 5, e.g., on the positions at which the DCA process will later be carried out (FIG. 1F). This copper layer may be applied, for example, using a direct plating procedure, and substantially fills holes 3.

Figure 1G:
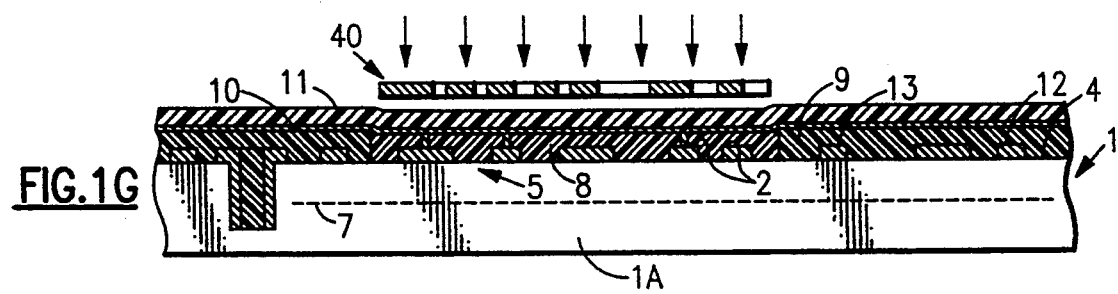
Figure 1H:
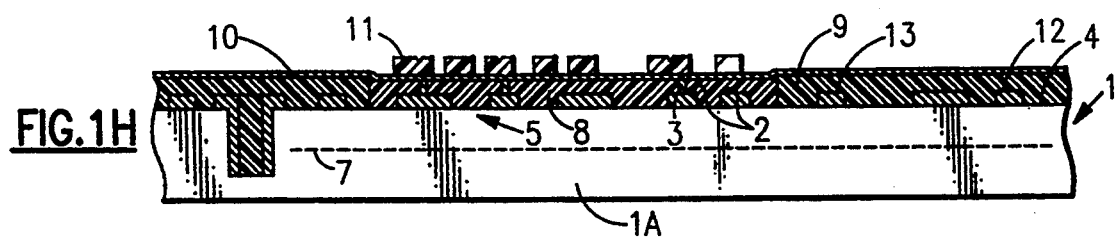

The entire printed circuit board 1, especially sub-region 5, is then coated with a second photoresist 11, this second photoresist preferably being a photoresist film applied by lamination (although a liquid photoresist may also be used). Once applied, this second photoresist is exposed through an image, for example using a photo mask 40, this exposure again concentrating on sub-region 5 and, as described further below, carried out in two stages. The second photoresist is then developed (FIGS. 1G, 1H). The positions for DCA-applied components are exposed separately for each of these positions, the stepper technique known for a long time in semiconductor technology preferably being used for this purpose.

Figure 1I:
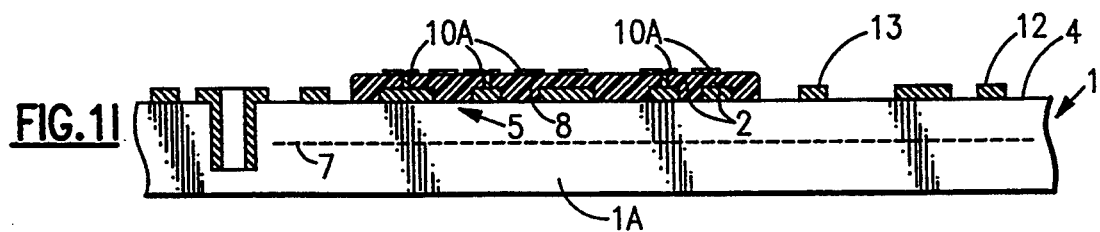

In the last operation, metal layer 10 is removed from the locations where it is not covered by photoresist 11, an operation which may be achieved by etching, for instance. Finally, the two photoresist layers 9 and 11 are removed. The conducting lines in sub-region 5 are now structured and connected to the copper layer beneath. The wiring density in sub-region 5 is preferably about four times greater than the wiring density in first region 4, e.g., it is greater than approximately 20 cm/cm$^2$, and preferably 40 cm/cm$^2$ (FIG. 1I).

The subsequent process operations, such as the application of a solder resist mask, correspond to the conventional operations in printed circuit board manufacture. Further description is not believed necessary.

Global registration marks 12, for example in the form of circular or rectangular marks, are applied to the edge region of printed circuit board 1 for the purposes of the registration of the regions to be exposed in the step in FIG. 1C. Mechanical registration is, however, no longer adequate in many cases. The regions of high wiring density and thus tight tolerances require optically detectable registration marks 13 for registration, as registration accuracies in the region of a few micrometers are required. Registration using marks 13 is thus preferably implemented by means of optical camera registration using an enlarging optical system.

The enhanced wiring density in sub-region 5 demands precise alignment with the glass master on registration and also the greatest accuracy in its manufacture. The yield from the photolithographic process depends essentially on the registration of the product (core/composite) to the glass master and the size of the product. Due to the teachings of the invention, the necessity for highly accurate glass masters is drastically reduced as a consequence of registration through registration marks 12 by means of optical camera registration and as a consequence of registration through the local registration marks 13 by means of projection through an optical enlarging system. At the same time, the positioning and registration of the products can be significantly simplified through an automated registration and enlargement routine.

This step-by-step routine allows the regions with the lower tolerance requirements and the "fine-line" regions for the DCA items to be exposed independently of one another. Optical registration uses optical features present on the glass master and/or the product. FIGS. 2A and 2B reveal an automated registration/exposure system of this type, FIG. 2A being in elevation and 2B in plan.

Figure 3B:
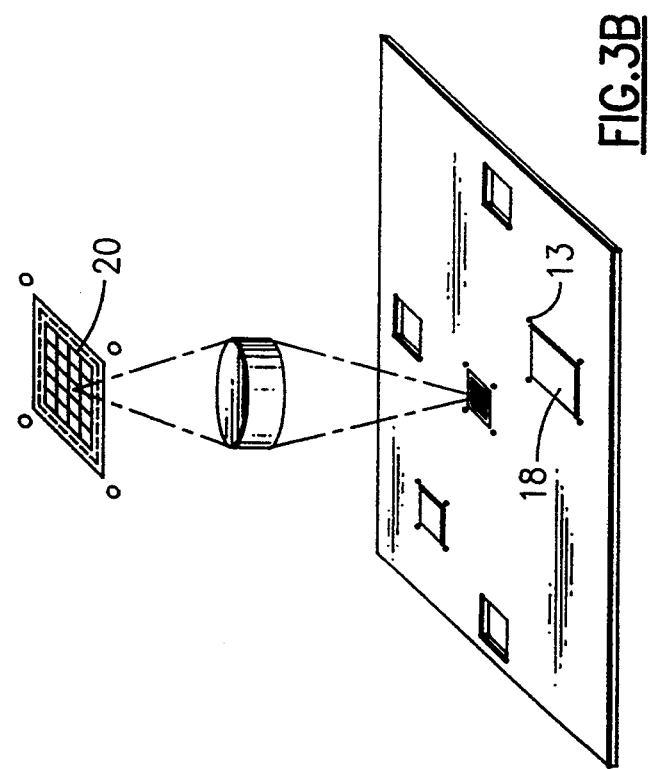
FIGS. 3A and 3B illustrate schematic representations of the exposure sequence during the method of this invention.
Figure 3A:
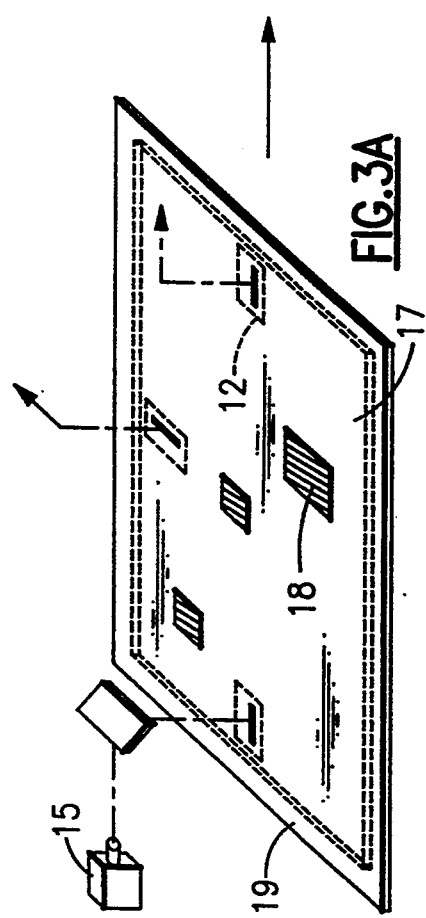

Glass master 19 (FIG. 3A) and product 17 are both transferred to the exposure bench 14 by means of a transport and loading device. First the glass master is transferred to a frame on the exposure bench, positioned using a camera system 15 and is held in this position either mechanically or using a vacuum. The product is then transported to its position and automatically registered with respect to the glass master. The product is then exposed through a mask 16 in a first exposure unit 22. The DCA positions are initially masked by the "black (opaque) layer" 18 on the glass master, thus preventing exposure of these regions in the first step (FIGS. 3A and 3B).

For the purpose of the second exposure process, the product is transferred into the second exposure unit 27 (FIG. 2A) of the device by means of a second carrying and positioning device. This exposure device, preferably a projection printing device with a rotating head, is now activated, the DCA positions being sought out by a camera and being registered in the vicinity of the chip positions with the assistance of local position markings 13. Since these registration marks are applied to the product at the same time as the outer conducting line tracks, such marks are closely related to the conducting line pattern (FIG. 3).

Figure 4:
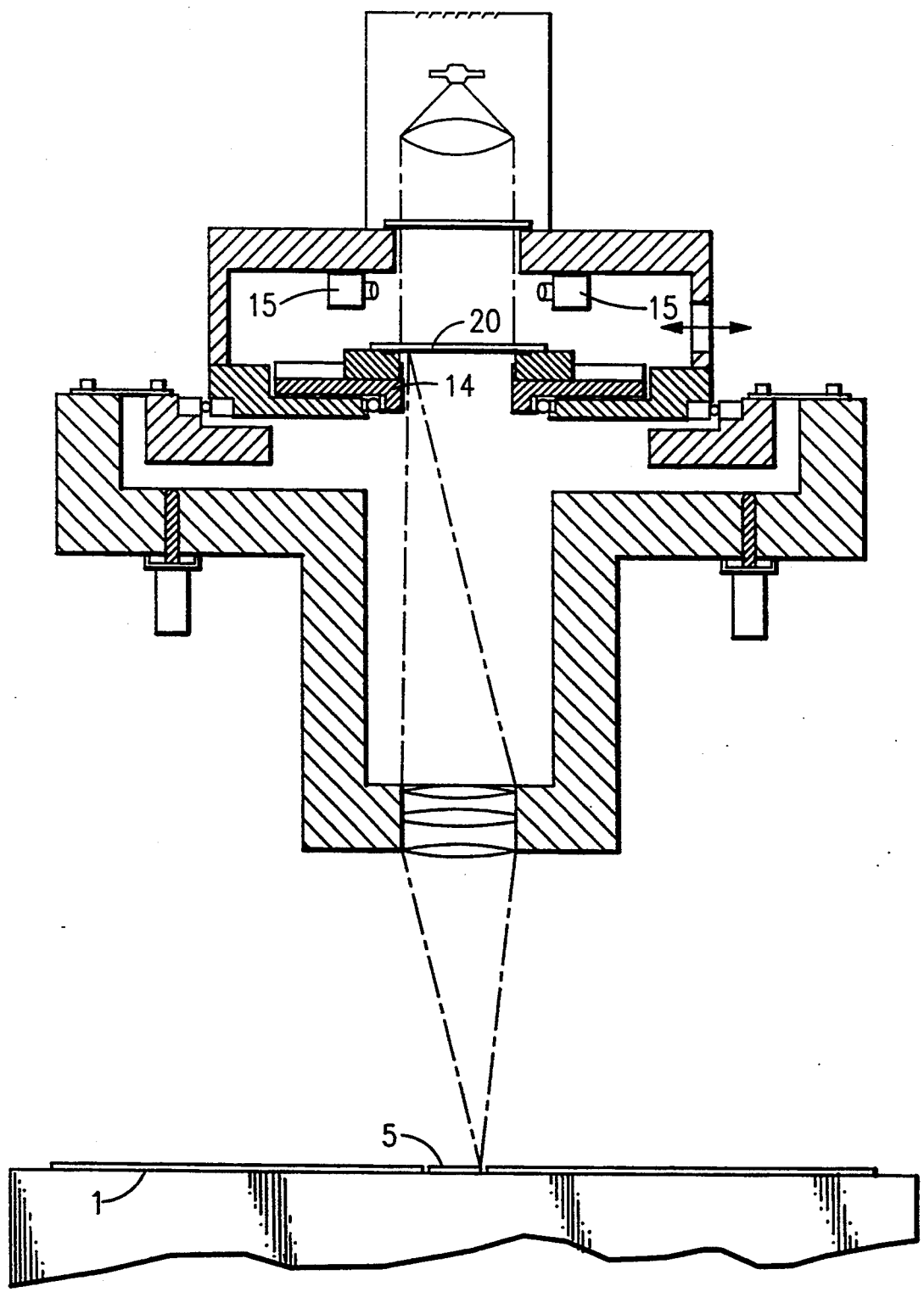
FIG. 4 illustrates a rotating exposure head for the implementation of the process of this invention.

It is possible to match the widest variety of masks to the layout on the printed circuit board 1 due to the rotating head of the projection printing device (FIG. 4). Once the product is secured in the appropriate position, the DCA positions are exposed using a chip site mask 20. Said operations are repeated as many times as is necessary until all the DCA positions are exposed. Then the product is transferred to a device in which the development, etching and removal processes are carried out. The exposure head moves in the x-y plane during exposure to ensure that the total active region of the product is covered.

Fine adjustment of the high precision registration for x, y and angle theta is carried out in the upper part of the exposure head. This may be done by a precision positioner, ensuring simple construction of the head. The rapid re-positioning of the rotating head to the next DCA position may be effected by a Personal Computer (PC) with a connected linear stepper motor.

The product is then transferred to the delivery station 23 of the exposure device and made available for the remaining operations in the process.

Figure 5:
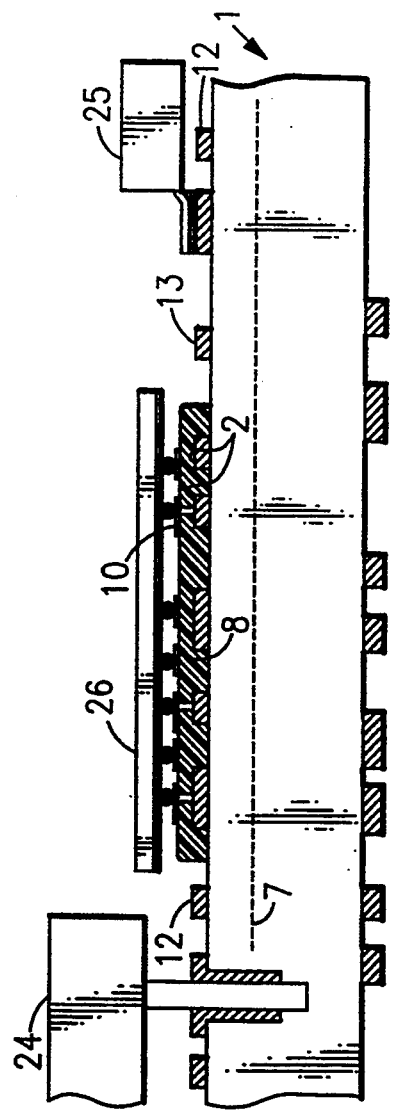
FIG. 5 illustrates the schematic structure of a printed circuit board on which are simultaneously mounted PIH and SMT components and chips.

As a result of the method of this invention, it is possible to provide a very high wiring density of electrically conductive conductors (e.g., lines) 10A (FIG. 1I) only in those regions of the printed circuit board in which semiconductor components are to be attached directly, e.g., in regions with very high requirements regarding I/O density. In this way it is possible to manufacture printed circuit boards with locally enhanced wiring density, permitting, among other advantages, the simultaneous placement on a board of inexpensive PIH (24) or SMT components (25) and chips (26) (FIG. 5).

While there have been shown and described what are at present considered the preferred embodiments of the invention, it will be obvious to those skilled in the art that various changes and modifications may be made therein without departing from the scope of the invention as defined by the appended claims.

What is claimed is:

1. A printed circuit board comprising:
   a dielectric material having at least one inner electrically conductive layer;
   electrically conducting lines located on an external surface of said dielectric material in a first region of a first width and having a first wiring density;
   a layer of a second dielectric material substantially covering a localized sub-region of said first region of said electrically conducting lines and including a plurality of holes therein, selected ones of said holes being located relative to respective ones of said conducting lines in said sub-region, said localized sub-region having a second width less than said first width of said first region, said layer of second dielectric material not including an internal layer of conductive wiring therein; and
   a plurality of electrical conductors located only on said layer of second dielectric material and electrically coupled to said respective ones of said conducting lines in said localized sub-region through said holes, said electrical conductors being of a second wiring density substantially greater than said first wiring density of said electrically conducting lines.

2. The printed circuit board according to claim 1 wherein said second wiring density is about four times that of said first wiring density.

3. The printed circuit board according to claim 1 wherein said first wiring density is from about 5 cm/cm$^2$ to about 10 cm/cm$^2$, and said second wiring density is from about 20 cm/cm$^2$ per layer to about 40 cm/cm$^2$.

4. The printed circuit board according to claim 1 wherein said electrical conductors located on said layer of second dielectric material are comprised of copper.

5. The printed circuit board according to claim 1 wherein said layer of second dielectric material possesses a dielectric constant from about 2.5 to about 3.5.

6. The printed circuit board according to claim 5 wherein said second dielectric material is comprised of polyimide.

* * * * *